US011131697B2

(12) United States Patent
Butler et al.

(10) Patent No.: US 11,131,697 B2
(45) Date of Patent: Sep. 28, 2021

(54) SYSTEM AND METHOD FOR COMBINING A REMOTE AUDIO SOURCE WITH AN ANIMATRONICALLY CONTROLLED PUPPET

(71) Applicants: Sean C. Butler, Kirkwood, MO (US); Ryan P. Butler, Kirkwood, MO (US)

(72) Inventors: Sean C. Butler, Kirkwood, MO (US); Ryan P. Butler, Kirkwood, MO (US)

( * ) Notice: Subject to any disclaimer, the term of this patent is extended or adjusted under 35 U.S.C. 154(b) by 0 days.

(21) Appl. No.: 17/009,916

(22) Filed: Sep. 2, 2020

(65) Prior Publication Data
US 2021/0065747 A1 Mar. 4, 2021

Related U.S. Application Data

(60) Provisional application No. 62/892,221, filed on Aug. 27, 2019.

(51) Int. Cl.
| | |
|---|---|
| *G10L 15/22* | (2006.01) |
| *G01R 25/00* | (2006.01) |
| *G01R 21/133* | (2006.01) |
| *H02J 13/00* | (2006.01) |
| *G06F 3/16* | (2006.01) |
| *G10L 13/02* | (2013.01) |
| *G11B 27/031* | (2006.01) |
| *H04N 5/765* | (2006.01) |

(52) U.S. Cl.
CPC ......... *G01R 25/005* (2013.01); *G01R 21/133* (2013.01); *G06F 3/167* (2013.01); *G10L 13/02* (2013.01); *G10L 15/22* (2013.01); *G11B 27/031* (2013.01); *H02J 13/00002* (2020.01); *H02J 13/00006* (2020.01); *H04N 5/765* (2013.01); *H02J 13/00036* (2020.01)

(58) Field of Classification Search
None
See application file for complete search history.

(56) References Cited

U.S. PATENT DOCUMENTS

| | | | |
|---|---|---|---|
| 2005/0027794 A1* | 2/2005 | Decker | G08C 17/00 709/201 |
| 2018/0336716 A1* | 11/2018 | Ramprashad | H04L 51/10 |
| 2020/0097011 A1* | 3/2020 | Mika | B25J 9/1664 |

\* cited by examiner

*Primary Examiner* — Eileen M Adams (57) ABSTRACT

A system and method for combining a remote audio source with an animatronically controlled puppet includes the steps of entering an audio file on a user client by a person where the audio file is a statement spoken by the person. The audio file is sent to a secondary client that is remote to the user client. The secondary client has a puppet controlled by animatronics. The audio file is received by an audio circuit board that converts the audio file into movement parameters. The movement parameters are sent to at least one servo-mechanism mounted in the puppet to actuate the animatronics in synchronicity with the audio file. Movement of the puppet is video recorded to define a video file. The audio and video files are combined to define a final video production viewable by the person.

7 Claims, 5 Drawing Sheets

SYSTEM AND METHOD FOR COMBINING A REMOTE AUDIO SOURCE WITH AN ANIMATRONICALLY CONTROLLED PUPPET

CROSS-REFERENCE TO RELATED APPLICATIONS

I hereby claim the benefit under 35 U.S.C. Section 119(e) of U.S. Provisional application 62/892,221 filed Sep. 5, 2019.

STATEMENT REGARDING FEDERALLY SPONSORED RESEARCH OR DEVELOPMENT

Not Applicable

THE NAMES OF THE PARTIES TO A JOINT RESEARCH AGREEMENT

Not Applicable

INCORPORATION-BY-REFERENCE OF MATERIAL SUBMITTED ON A COMPACT DISC OR AS A TEXT FILE VIA THE OFFICE ELECTRONIC FILING SYSTEM

Not Applicable

STATEMENT REGARDING PRIOR DISCLOSURES BY THE INVENTOR OR JOINT INVENTOR

Not Applicable

BACKGROUND OF THE INVENTION

(1) Field of the Invention

The disclosure relates to image and audio combining system and more particularly pertains to a new image and audio combining system for allowing a person to create and send an audio file via the internet to a secondary location where the secondary location utilizes the audio file to define movement parameters for a puppet being actuated by servomechanisms. The actuations mimic the movements of a person speaking which are in sync with the audio file. These actuations are captured by video recording of the movements to create a video file. The audio and video files are combined to define a final video production which may be viewed by the creator of the audio file and others.

(2) Description of Related Art Including Information Disclosed Under 37 CFR 1.97 and 1.98

The prior art relates to the combination of audio signals and animatronically controlled devices such that the animatronically controlled device creates movement that are synced to the audio signals.

BRIEF SUMMARY OF THE INVENTION

An embodiment of the disclosure meets the needs presented above by generally comprising the steps of entering an audio file on a user client by a person where the audio file comprises a statement spoken by the person. The audio file is sent to a secondary client that is remote to the user client. The secondary client has a puppet controlled by animatronics. The audio file is received by an audio circuit board that converts the audio file into movement parameters. The movement parameters are sent to at least one servomechanism mounted in the puppet to actuate the animatronics in synchronicity with the audio file. Movement of the puppet is video recorded to define a video file. The audio and video files are combined to define a final video production viewable by the person.

In another embodiment, a user client is configured to receive audio input by a person to create an audio file. The user client is in communication with the internet. A server is in communication with the internet and is remote with respect to the user client. The server receives the audio file from the from the user client. A secondary client is in communication with the server. The secondary client includes a puppet controlled by animatronics having a servomechanism for controlling movement of the puppet, an audio circuit board is in communication with the servomechanism configured to convert the audio file into movement parameters such that the puppet moves in synchronicity with the audio file, and a video recorder to video the puppet when the puppet moves to create a video file. The video file and audio file are combined to define a final video production viewable on the user client.

There has thus been outlined, rather broadly, the more important features of the disclosure in order that the detailed description thereof that follows may be better understood, and in order that the present contribution to the art may be better appreciated. There are additional features of the disclosure that will be described hereinafter and which will form the subject matter of the claims appended hereto.

The objects of the disclosure, along with the various features of novelty which characterize the disclosure, are pointed out with particularity in the claims annexed to and forming a part of this disclosure.

BRIEF DESCRIPTION OF SEVERAL VIEWS OF THE DRAWING(S)

The disclosure will be better understood and objects other than those set forth above will become apparent when consideration is given to the following detailed description thereof. Such description makes reference to the annexed drawings wherein.

DETAILED DESCRIPTION OF THE INVENTION

With reference now to the drawings, and in particular to FIGS. 1 through 4 thereof, a new image and audio combining system embodying the principles and concepts of an embodiment of the disclosure and generally designated by the reference numeral 10 will be described.

As best illustrated in FIGS. 1 through 4, the system 10 method for combining a remote audio source with an animatronically controlled puppet generally comprises a system wherein a person can record their voice as an audio file 12, which is then transmitted remotely via the internet 14 to a second location having a puppet 16 that is controlled by animatronics 18. It should be understood that the internet 14 may be provided by any conventional signal including Wi-Fi, Bluetooth and cellular communication networks. The animatronics 18 are in communication with an audio circuit board 38 which converts the audio file 12 in a conventional manner into movement parameters. The movement parameters are then sent to servomechanisms of the animatronics 18 to control the puppet 16 such that the puppet 16 appears to "speak" in synchronicity with the audio file 12. A video camera 20 records the movements of the puppet 16 to create a video file 22. The video file 22 is combined with the audio file 12 to create a final video production 24. This final video production 24 is then transmitted via the internet 14 back to the person so that they may then view and hear a puppet 16 "speaking" with their own voice.

In a broader sense, the person will utilize a user client 26 to access a program, typically within a conventional browser, that will allow the person to record the audio file 12. However, it should be understood that the term "audio file" used herein may include an actual, pre-recorded audio file or may include a live streaming audio. An advantage of a recorded audio file is that the user may re-record the message until it is perfected while live streaming would allow the user to see the animatronics 18 being utilized in real time.

The user client 26 may be utilized with any conventional electronic device used for accessing the internet 14 and which includes a display screen 28 for viewing options and selections, an input 30 for inputting selections and a microphone 32 to record/receive audio from the person. Understandably then, the user client may comprise a program which is loaded onto or accessed by computers, tablets, cellular phones and the like. The audio file 12 is typically a statement, made by the person, which the person wants to see animated by the puppet 16. That is, the puppet 16 will perform actions as though the audio recorded or streamed by the person is being spoken by the puppet 16.

The user client 26 is communication with the second location via the internet 14, wherein the second location may be defined as the secondary client 34. Intermediary to the user client 26 and the secondary client 34 would typically be a server 36 which is receiving, organizing and transmitting data between the user client 26 and the secondary client 34. The secondary client 34 will typically be remote with respect to the user client 26 and may also be remote to the server 36.

The secondary client 34, which may include multiple secondary clients 34, includes the animatronically controlled puppet 16 and video recording means to visually record the puppet 16 as it is actuated by the animatronics. While voice actuated animatronics have been previously achieved, such has not been done remotely such that a person can readily have access to such a puppet. When the secondary client 34 receives the audio file 12 from the user client 26 via the internet 14, the secondary client 34 transforms the audio file 12, which again may include an audio stream or streaming audio, into movement parameters with an audio circuit board 38. The audio circuit board 38 controls the servo-mechanisms, or animatronics 18, of the puppet 16 to provide the puppet 16 with lifelike movement and actions.

The secondary client 34 will typically include multiple ones of the animatronically controlled puppets 16. Thus, the person will be able to view each puppet with the user client 26 and thereafter select which puppet 16 they would like to use. Each puppet 16 would include its own servomechanisms and each would also likely include its own video camera 20. As the puppet 16 moves in synchronous motion with the audio file 12, the video camera 20 will record the puppet 16 movements to create a video file 22. The audio file 12 and the video file 22 are combined as the video file 22 is being created to create a final production video 24. The final production video 24 includes both the audio file 12 and the video file 22 and can be viewed by the person as a completed project. The final production video 24 will typically be sent to the user client 26 via the internet 14, however, the user client 26 may be utilized on the person's electronic device, or other electronic devices, to view the final production video 24 on other electronic devices. Furthermore, the person may utilize the user client 26 to send the final production video 24 to other electronic devices by email or other data sharing platforms.

In one embodiment, the system 10 includes a user client 26 which is embedded in an application 50 used on a computer, electronic notepad, or, more commonly, a cellular phone. The application 50 will allow a user to create user identification 52 for themselves that can later be associated with an audio file 12 and a puppet identification 54. More particularly, the user of the system 10 utilizes the input 30 from the user client 26, such as selectable icons/buttons, on the user client 26. Should a cellular phone be utilized, the input 30 will typically be a touchscreen having icons thereon. The user identification 52 will be unique to the user or the application 50 while the puppet identification 54 is selectable from a number of different puppets 16. The user will use the microphone 32 to record the audio file 12 and that audio file will be associated with the user identification 52. An environment may be created for the puppet 16 by utilizing a background video 56 that is selectable by the user 50. Alternatively, it should be understood that the background video 52 may instead comprise a non-moving digital image. The background video 56 may comprise pre-shot recorded video supplied by the application 50 or a video recording, or digital image, that is supplied by the user and which may be stored on the user's electronic device for access by the application 50. As stated above, a video file 22 of the puppet 16 is created showing the movement created by the animatronics 18. The background video or digital image may be positioned behind the puppet 16 using common video editing techniques such as, for example, utilizing a green-screen 62 behind the puppet.

The system 10 further includes a server 36 that may or may not be at a same physical location as the secondary client 34, wherein the server 36 and the secondary client 34 are remote from the user client 26. The server 36 typically include a conventional server engine 58 and data file system 60 that includes data tables such as user, puppet, background, and video file tables from which a user may select options using the user client 26. The server 36 stores the audio file 12, user identification 52, puppet identification 54 and background video 56 or digital image selected by the user of the system 10. The audio file 12 may then be sent to the audio circuit board 38 for decoding for the puppet 16 associated with the puppet identification 54, such that the animatronics 18 of that selected puppet 16 will be actuated synchronously with the audio file 12 such that it appears as though the puppet 16 is "speaking" the words on the audio file 12. The camera 20 records a video file 22 of the puppet 16 actuations. The video file 22 and audio file 12 are then combined. This may be accomplished utilizing conventional editing or browser based software, however, the secondary client 34 may include a sound emitter and microphone for audibly playing, and re-capturing, the audio file 12 while the puppet 16 is being actuated. Once the video file 22 and audio file 12 are combined, they define a final production video 24 that is stored as a digital file and may be sent back to the user client 26, typically via the internet, so that it will be shown on the display 28 of the user's device. As a cellular phone, for example, includes a speaker, the playing of the final production video 24 will allow the user to see the video file 22 and synchronized audio file 12 with the movements of the puppet 16. Further, should the user select a background video 56 or digital image it will be added to the final production video 24.

The system 10 may include options for the user to send the final production video 24 to the other persons. This may be done for example, by allowing the user to email the final production video 24 to others. Alternatively, the system 10 may include within its file system 60 stored final production videos 24 which can be accessed by others using links provided to the user for sharing with others or sent directly to other persons.

In one embodiment, the steps of a method of creating a video of a real puppet in real time, or very nearly real time, via a communications network includes a user utilizing a user client 26 having an application 50 or browser thereon wherein the application 50 requests user inputs. The user will select a user identification 52 and a puppet identification 54 associated with a selected one of the puppets 16. The user may, at this time, also select a background video 56. The application 50 will instruct the user to record an audio file 12 that will be stored on the server 36. The user may possibly re-record the audio file 12 should the user be dissatisfied with the audio file 12 or if the user overruns an amount of time allowed for audio file 12 recording. The server 36 sends the audio file 12 to the secondary client 34 that includes an audio output device in communication with an audio circuit board 38 which is associated with the puppet identification 54. The audio circuit board 38 is in communication with the animatronics 18 of the selected puppet 16 and actuates the selected puppet 16 synchronously with the audio file 12 as a camera 20 records a video file 22 of the actuated puppet 16. The video file 22 and audio file 12 are combined to create a final production video that is stored on the server 36 and transmitted back to the user for playback on the application 50.

In another embodiment, the directly preceding method may include a background video 56 that is selectable by user input on the application 50. The background video 56 may be added to the final production video 24 by editing software or may be played on a video display behind the puppet 16 such that camera 20 records the video display while recording the puppet 16.

Figure 1:
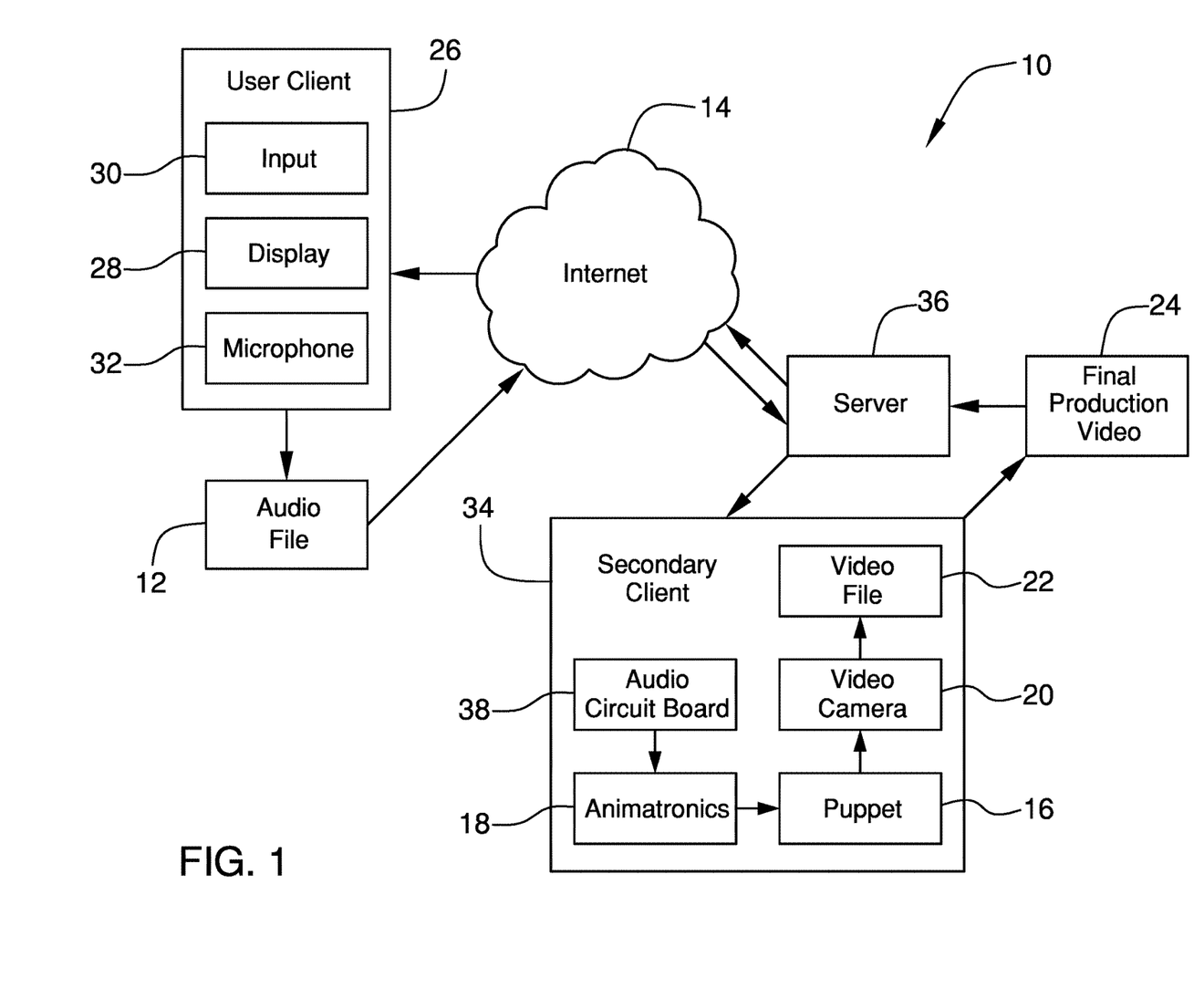
FIG. 1 is a block diagram of an embodiment of the disclosure showing a general overview thereof.
Figure 2:
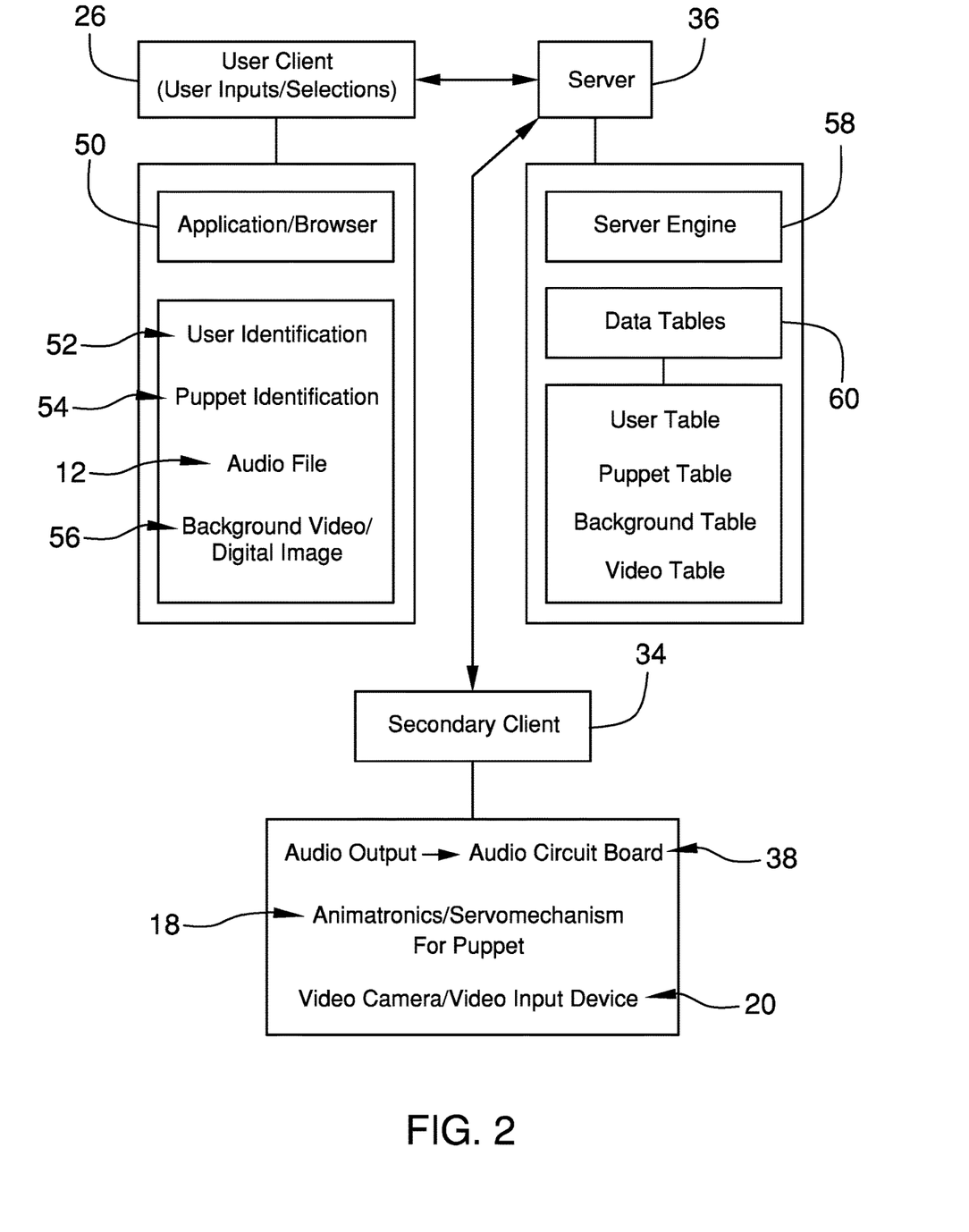
FIG. 2 is a block diagram illustrating an embodiment of the present invention.
Figure 3:
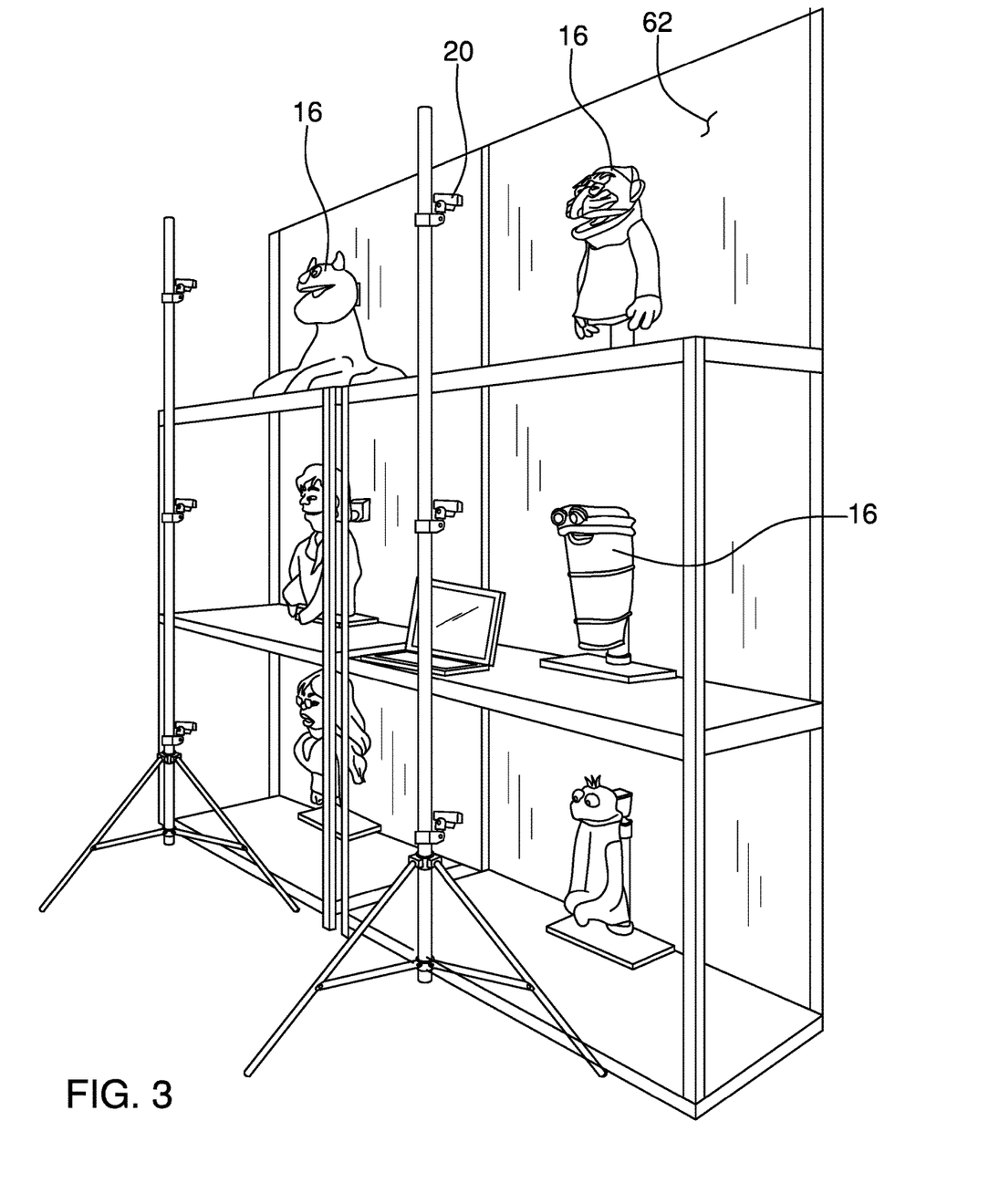
FIG. 3 is front perspective view of a system according to an embodiment of the present invention.
Figure 4:
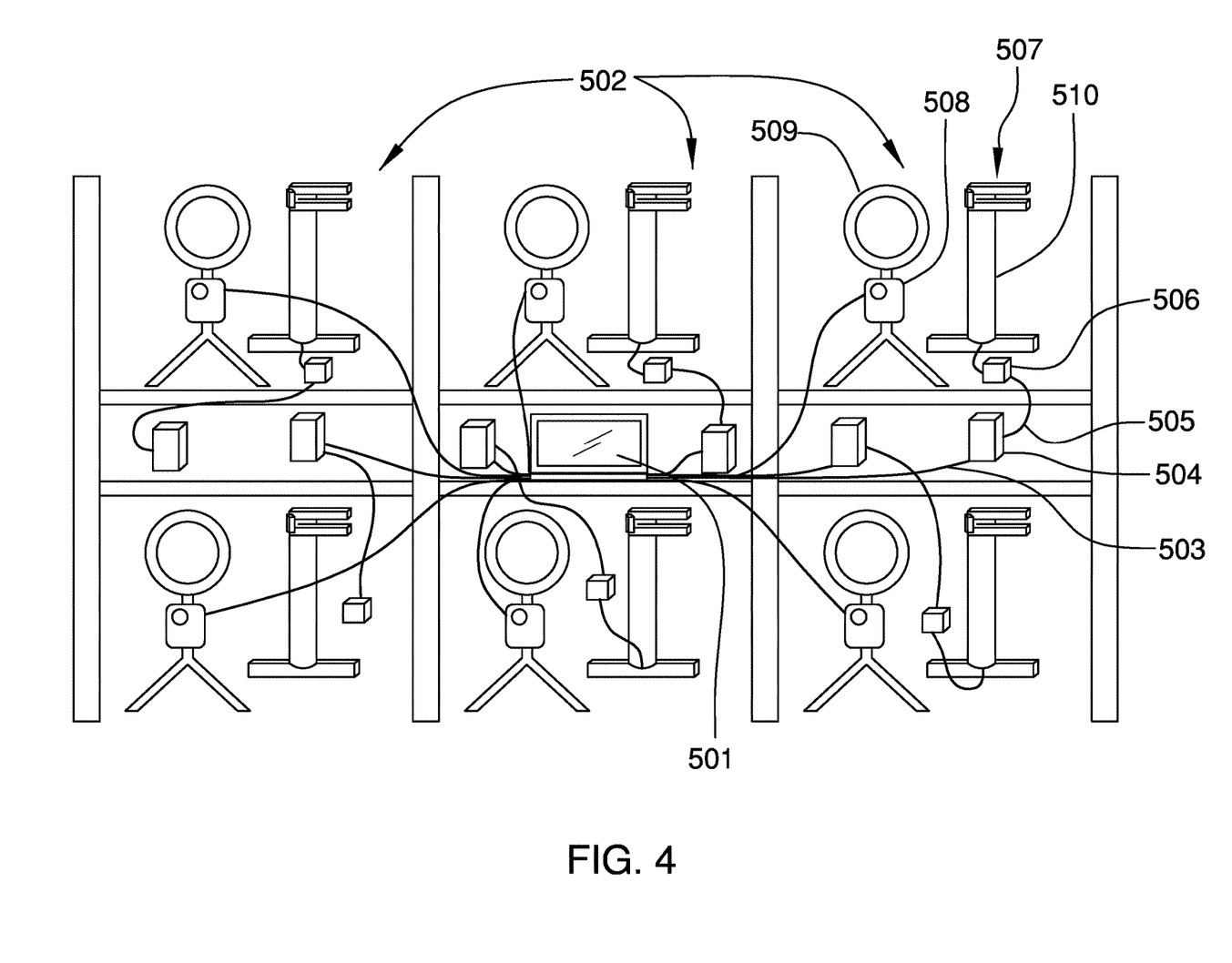
FIG. 4 is a block diagram illustrating a secondary client physical location and connectors in an embodiment of the present invention.

FIG. 4 is an object diagram illustrating an embodiment of the present invention's physical location where a plurality of multiple puppet instances 502 are connected to a single secondary client 501 system. For each puppet instance 502 in this example, there is an audio connection 503 from the secondary client 501 to an audio output device 504 to deliver audio from secondary client 501 to the audio output device 504. There is a subsequent audio connection 505 from the audio output device 504 to the audio circuit board 506. The audio circuit board 506 is then electrically connected to at least one servo housed within the mechanical head unit 507 of a puppet stand 510. There is also a video input device 508 that is connected to the secondary client 501 that provides a video file. There are also optional lighting components 509 to illuminate the puppet stand 510 for better viewing.

Figure 5:
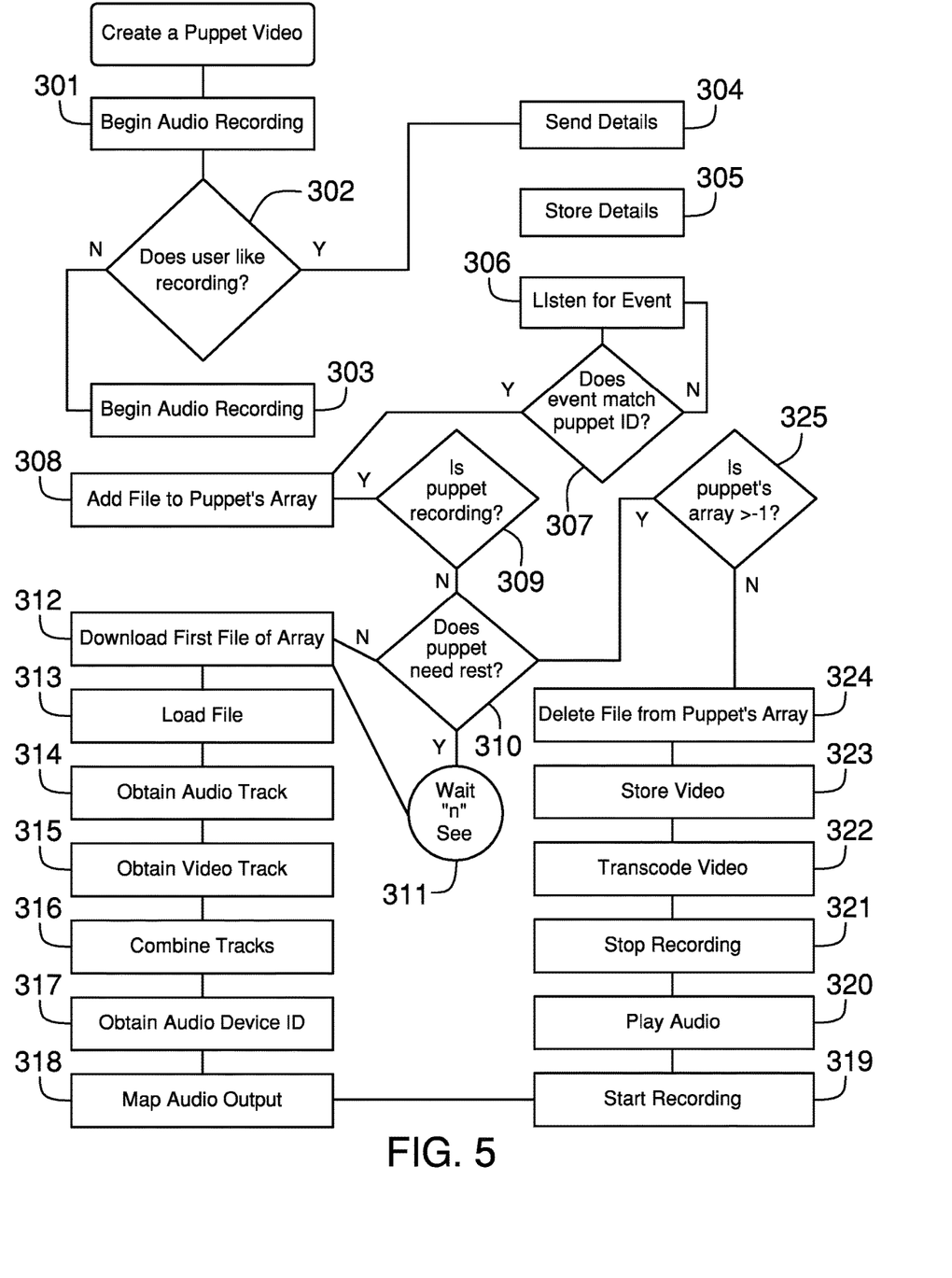
FIG. 5 is a flow diagram of an embodiment of the present invention.

FIG. 5 is a flow diagram of a routine that creates a real-time video of a real puppet via a communications network. Once the client system has identified a user and the user has identified a puppet, the user can take action, such as a click of a button, to start recording audio 301. Upon the stoppage of the audio recording either by user interaction, such as clicking a button, or client system initiated in the case of a timer threshold expiring, the user is prompted 302 and must decide whether or not the recorded audio suffices. If the user determines that the audio does not suffice, the user will be given the opportunity to record audio again with the same identified puppet or a different puppet. If the user approves the audio recording, the client system will send the file and details 304 regarding the user, puppet, audio and future video files to the server system. The server system will then store 305 the audio file in a file system and create a record in the video data table referencing said stored file with appropriate details identifying the user, puppet, audio file reference, and future video file reference. The secondary client system has an event listener 306 established waiting for a record to be created in the video data table.

When a record is created in the table being listened to, the secondary client finds the puppet identifier in the object returned from the event listener and tries to match it with the pre-defined puppet identifier specified for this puppet instance 307. If the puppet identifier does not match the puppet identifier for the specified instance, the puppet instance will continue to listen for events. If the puppet identifier does match the identifier for the puppet instance, then the browser will add the reference to the audio file specified in the returned record object to a predefined array for that particular puppet instance 308. The browser will check to see if the current puppet instance is currently recording a video 309. If the puppet instance is recording, the flow will stop after adding the audio file reference to the puppet's array. If the puppet instance is not currently recording, the browser of the client system will then determine if the puppet's recent workload requires the puppet take a rest before proceeding 310 based on a pre-defined time threshold. If the browser determines that the puppet does not need a rest, the browser will download the first file reference of the puppet instance array, at index "0" 312. If the browser determines that the puppet does need a rest, the browser will initiate a timer for a pre-determined number of seconds and only when that timer expires will the browser download the first file reference of the puppet instance array, at index "0" 311. After the file is downloaded, the browser will load the audio file into an audio media player within the browser attributed to the puppet instance 313. Once the file has been loaded, the browser will obtain the audio track for the audio file loaded into the audio player 314. The browser will then identify the proper video device specified by a predefined device id for the specific puppet instance and obtain the video track object of that active video device 315. The browser will then combine the video and audio tracks into one media stream object 316. The browser will then identify the proper audio output device specified by a predefined audio device id for that specific puppet instance 317 and set that audio device id as the sole audio output for the specific audio media player for that specific puppet instance 318. The browser of the secondary client system will then begin recording the created media stream object 319. Once the recording of the media stream object has begun the browser will play the audio media player for the specific puppet instance 320. The browser has established a listener for the audio file to end at which point the browser will stop the recording of the media stream object 321. In this embodiment of the invention, the client system performs transcoding of the video file 322 to an acceptable file format before uploading and storing the video 323 in the file system of the server system. After the video is stored in the file system of the server system, the server system will update the previously created record in the video data table with a reference to the newly created video file in the file system.

It should be understood that the transcoding of the video file 322 would include placement of a digital image or background video 56 in place of a background color created by the green-screen 62.

After uploading the finished video file to the server system, the secondary client system will remove the audio file which it just used to create the video file from the puppet instance's array 324. The browser system will then obtain the length of the puppet instance's array 325. If the puppet instance's array is one or more, the browser of the client system will then determine if the puppet's recent workload requires the puppet take a rest before proceeding. If the browser determines that the puppet does not need a rest, the browser will download the first file reference of the puppet instance array, at index 0. If the browser determines that the puppet does need a rest, the browser will initiate a timer for a specified number of seconds and only when that timer expires will the browser download the first file reference of the puppet instance array, at index 0.

Once the browser's database event listener has been established, it will continue to listen even while the puppet instance is recording. It will continue to append audio file references to the end of the puppet instance's array.

With respect to the above description then, it is to be realized that the optimum dimensional relationships for the parts of an embodiment enabled by the disclosure, to include variations in size, materials, shape, form, function and manner of operation, assembly and use, are deemed readily apparent and obvious to one skilled in the art, and all equivalent relationships to those illustrated in the drawings and described in the specification are intended to be encompassed by an embodiment of the disclosure.

Therefore, the foregoing is considered as illustrative only of the principles of the disclosure. Further, since numerous modifications and changes will readily occur to those skilled in the art, it is not desired to limit the disclosure to the exact construction and operation shown and described, and accordingly, all suitable modifications and equivalents may be resorted to, falling within the scope of the disclosure. In this patent document, the word "comprising" is used in its non-limiting sense to mean that items following the word are included, but items not specifically mentioned are not excluded. A reference to an element by the indefinite article "a" does not exclude the possibility that more than one of the element is present, unless the context clearly requires that there be only one of the elements.

We claim:

1. A method of combining audio with a remote controlled animatronically controlled device, the method including the steps of:
   entering an audio file on a user client by a person, the audio file comprising a statement spoken by the person;
   sending the audio file to a secondary client, the secondary client being remote to the user client, the secondary client having a puppet controlled by animatronics;
   receiving the audio file by an audio circuit board;
   converting of the audio file into movement parameters by the audio circuit board;
   sending the movement parameters to at least one servomechanism mounted in the puppet to actuate the animatronics in synchronicity with the audio file;
   video recording movement of the puppet to define a video file;
   combining the audio and video files to define a final video production viewable by the person;
   utilizing an electronic device by the person, the electronic device including an input; and
   actuating the input by the person to select one of a plurality of puppets to define a selected puppet, wherein the audio file is sent to the animatronics of the selected puppet.

2. The method of claim 1, further including the step of sending the final video production to the person through an internet connection.

3. The method of claim 1, further including the step of recording the audio file by the person on the electronic device with a microphone connected to the electronic device.

4. A method of combining audio with a remote controlled animatronically controlled device, the method including the steps of:
   entering an audio file on a user client by a person, the audio file comprising a statement spoken by the person;
   sending the audio file to a secondary client, the secondary client being remote to the user client, the secondary client having a puppet controlled by animatronics;
   receiving the audio file by an audio circuit board;
   converting of the audio file into movement parameters by the audio circuit board;
   sending the movement parameters to at least one servomechanism mounted in the puppet to actuate the animatronics in synchronicity with the audio file;
   video recording movement of the puppet to define a video file;
   combining the audio and video files to define a final video production viewable by the person;
   selecting a background video;
   combining the background video with the video file and the audio file such that the final video production includes the background video being displayed behind the puppet.

5. A system for combining an audio file with a remote animatronically actuated device via an internet connection, the system including:
   a user client configured to receive audio input by a person to create an audio file, the user client being in communication with the internet;
   a server being in communication with the internet and being remote with respect to the user client, the server receiving the audio file from the from the user client;
   a secondary client being in communication with the server, the secondary client including:
      a puppet controlled by animatronics having a servomechanism for controlling movement of the puppet;
      an audio circuit board being in communication with the servomechanism and being configured to convert the audio file into movement parameters such that the puppet moves in synchronicity with the audio file;
      a video recorder to video the puppet when the puppet moves to create a video file; and
   wherein the video file and audio file are combined to define a final video production viewable on the user client;

wherein said user client includes an electronic device including a display, an input and a microphone, said microphone being configured to record the audio file; and wherein a combination of the puppet, the audio circuit board and the video recorder defining a puppet instance, the secondary client including a plurality of the puppet instances, said input being actuated to select one of the puppet instances to be associated with the audio file.

6. The system for combining an audio file with a remote animatronically actuated device via an internet connection according to claim 5, wherein the server includes a plurality of stored files comprising background videos, said input being actuated to select one of said background videos, wherein the background video selected by the input is combined with the video file and the audio file.

7. A system for combining an audio file with a remote animatronically actuated device via an internet connection, the system including:

a user client configured to receive audio input by a person to create an audio file, the user client being in communication with the internet;

a server being in communication with the internet and being remote with respect to the user client, the server receiving the audio file from the from the user client;

a secondary client being in communication with the server, the secondary client including:

a puppet controlled by animatronics having a servo-mechanism for controlling movement of the puppet;

an audio circuit board being in communication with the servomechanism and being configured to convert the audio file into movement parameters such that the puppet moves in synchronicity with the audio file;

a video recorder to video the puppet when the puppet moves to create a video file; and wherein the video file and audio file are combined to define a final video production viewable on the user client;

wherein said user client includes an electronic device including a display, an input and a microphone, said microphone being configured to record the audio file; and wherein the server includes a plurality of stored files comprising background videos, said input being actuated to select one of said background videos, wherein the background video selected by the input is combined with the video file and the audio file.

* * * * *